United States Patent
Luo et al.

(10) Patent No.: US 7,595,233 B2
(45) Date of Patent: Sep. 29, 2009

(54) GATE STRESS ENGINEERING FOR MOSFET

(75) Inventors: Zhijiong Luo, Carmel, NY (US); Yung Fu Chong, Singapore (SG); Huilong Zhu, Poughkeepsie, NY (US)

(73) Assignees: International Business Machines Corporation, Armonk, NY (US); Chartered Semiconductor Manufacturing Ltd, Singapore (SG)

( * ) Notice: Subject to any disclaimer, the term of this patent is extended or adjusted under 35 U.S.C. 154(b) by 155 days.

(21) Appl. No.: 11/421,510

(22) Filed: Jun. 1, 2006

(65) Prior Publication Data

US 2007/0278583 A1      Dec. 6, 2007

(51) Int. Cl.
*H01L 21/8238* (2006.01)

(52) U.S. Cl. .................. 438/199; 438/649; 438/651; 257/368; 257/E21.632

(58) Field of Classification Search ................ 438/199, 438/202, 205, 301, 305, 649, 651, 655, 664, 438/682, 721, 725; 257/368, E27.046, E27.064, 257/E21.632

See application file for complete search history.

(56) References Cited

U.S. PATENT DOCUMENTS

| | | | | |
|---|---|---|---|---|
| 5,468,684 | A | * | 11/1995 | Yoshimori et al. ............. 438/3 |
| 5,719,416 | A | * | 2/1998 | Yoshimori et al. .......... 257/295 |
| 6,214,709 | B1 | | 4/2001 | Chen |
| 6,451,693 | B1 | | 9/2002 | Woo et al. |
| 6,703,271 | B2 | * | 3/2004 | Yeo et al. .................... 438/221 |
| 6,858,506 | B2 | * | 2/2005 | Chang ........................ 438/301 |
| 2002/0192932 | A1 | | 12/2002 | Tsai et al. |
| 2005/0032321 | A1 | | 2/2005 | Huang et al. |

FOREIGN PATENT DOCUMENTS

TW        432507 B        5/2001

OTHER PUBLICATIONS

Unknown, "Properties of Metal Silicides," edited by Karen Maex, Marc Van Rossum, The Institution of Electrical Engineers, ISBN 0 85296 859 0, Table 1, pp. 18-23.

* cited by examiner

*Primary Examiner*—Thinh T Nguyen
(74) *Attorney, Agent, or Firm*—Joseph Petrokaitis; Hoffman Warnick LLC

(57) ABSTRACT

Methods of stressing a channel of a transistor as a result of a material volume change in a gate structure and a related structure are disclosed. In one embodiment, a method includes forming a gate over the channel, wherein the gate includes several materials, such as layers of silicon materials and a conducting material layer, above a gate dielectric, and is surrounded by a spacer, and then providing a volume change to some of the materials in the gate so that a stress is induced in the channel as a result of the volume change. A gate structure for a MOSFET structure may include a layer of silicon material over a gate dielectric and a first silicide and second silicide over the silicon material, where the first silicide induces a stress in a channel of the device. The first and second suicides may be separated by a layer of silicon material or in contact with each other.

2 Claims, 5 Drawing Sheets

GATE STRESS ENGINEERING FOR MOSFET

BACKGROUND OF THE INVENTION

1. Technical Field

This invention relates generally to semiconductor device manufacturing, and in particular the manufacture of metal oxide semiconductor field effect transistor (MOSFET) structures. More particularly, the invention relates to methods of making MOSFETs that apply gate stress engineering principles.

2. Background Art

With the aggressive scaling of complimentary metal oxide semiconductor (CMOS) technologies, stress engineering is becoming more important to improve device performance. The application of stresses to channels of field effect transistors (FETs) is known to improve their performance. When applied in a longitudinal direction (i.e., in the direction of current flow), tensile stress is known to enhance electron mobility (or n-channel FET (nFET) drive currents) while compressive stress is known to enhance hole mobility (or p-channel FET (PFET) drive currents).

The source of stress can be inserted from multiple elements in a MOSFET, such as the shallow trench isolation (STI), embedded source/drain stressors, a stressed substrate, or an additional nitride capping layer. In view of the foregoing, there is a need in the art for an improvement to the related art.

SUMMARY OF THE INVENTION

Methods of stressing a channel of a transistor as a result of a material volume change in a gate structure and a related structure are disclosed. In one embodiment, a method includes forming a gate over the channel, wherein the gate includes several materials, such as layers of silicon materials and a conducting material layer, above a gate dielectric, and is surrounded by a spacer, and then providing a volume change to some of the materials in the gate so that a stress is induced in the channel as a result of the volume change. A gate structure for a MOSFET structure may include a layer of silicon material over a gate dielectric and a first silicide and second silicide over the silicon material, where the first silicide induces a stress in a channel of the device. The first and second suicides may be separated by a layer of silicon material or in contact with each other.

A first aspect of the invention provides a method of stressing a channel of a transistor, comprising: forming a gate over the channel, wherein the gate includes a plurality of materials above a gate dielectric; and creating a volume change to at least a portion of the plurality of materials, thereby inducing a stress in the channel.

A second aspect of the invention provides a method of forming a gate structure for a MOSFET structure comprising: providing a substrate; providing a gate upon the substrate including: forming an oxide layer upon the substrate; forming a first layer of a silicon material above the oxide layer; forming a layer of a conducting material above the first layer; forming a second layer of a silicon material above the layer of conducting material, wherein the first layer, the second layer, and the conducting material layer collectively have a first volume; forming the gate from the layers; and performing a process subsequent the forming steps, whereby a silicide is formed from the conducting material and the silicon material, wherein the first layer, the second layer, and the silicide collectively have a second volume different than the first volume.

A third aspect of the invention provides a gate structure for a MOSFET structure, comprising: a gate dielectric on a substrate; a first layer of a silicon material overlying the gate dielectric; a first silicide overlying the first layer of the silicon material and in contact therewith, wherein the first silicide induces a stress in a channel in the MOSFET structure; and a second silicide overlying the first silicide.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
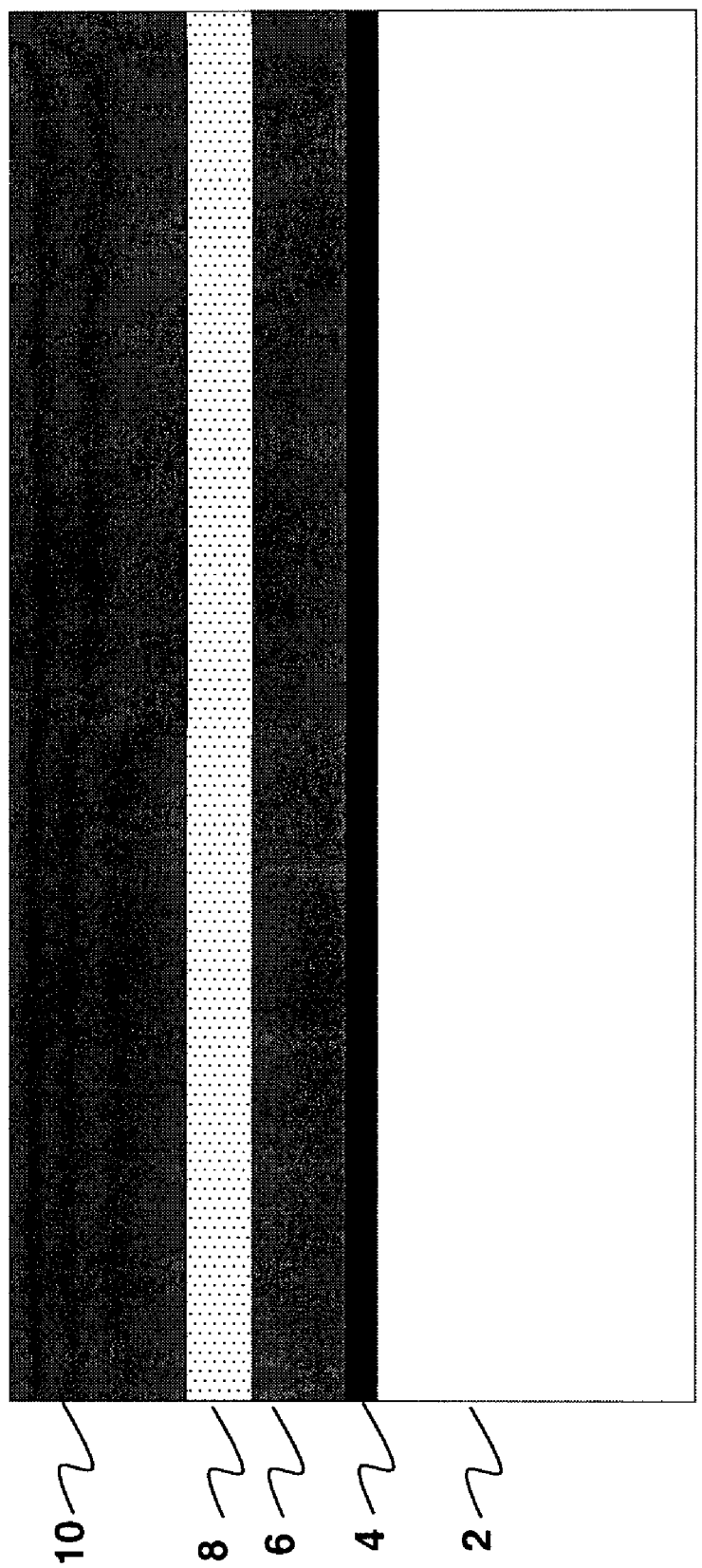
FIGS. 1-3 show cross-sectional views of one embodiment of a method according to the invention.
Figure 4:
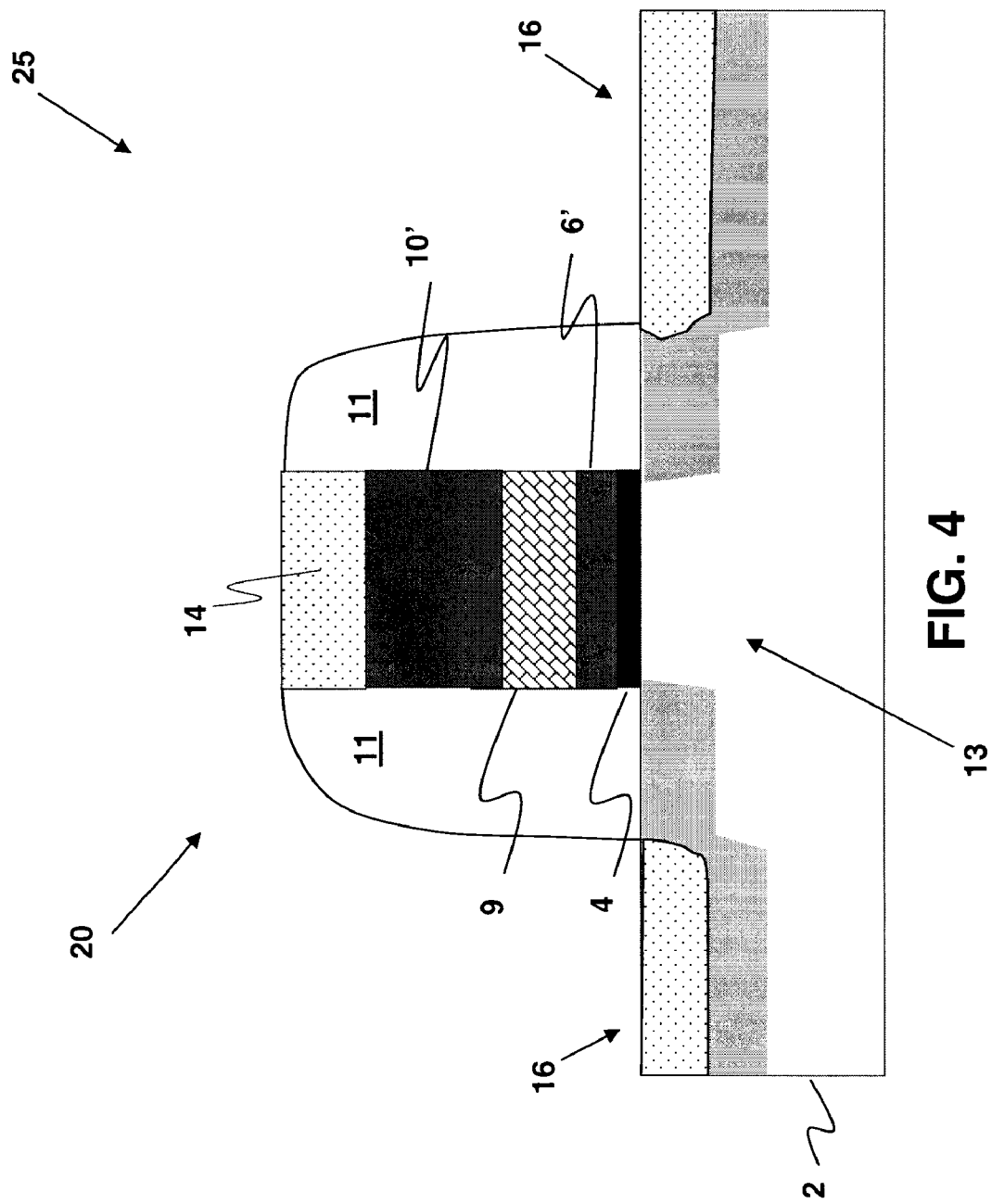
FIG. 4 shows a cross-sectional view of one embodiment of a structure according to the invention.
Figure 5:
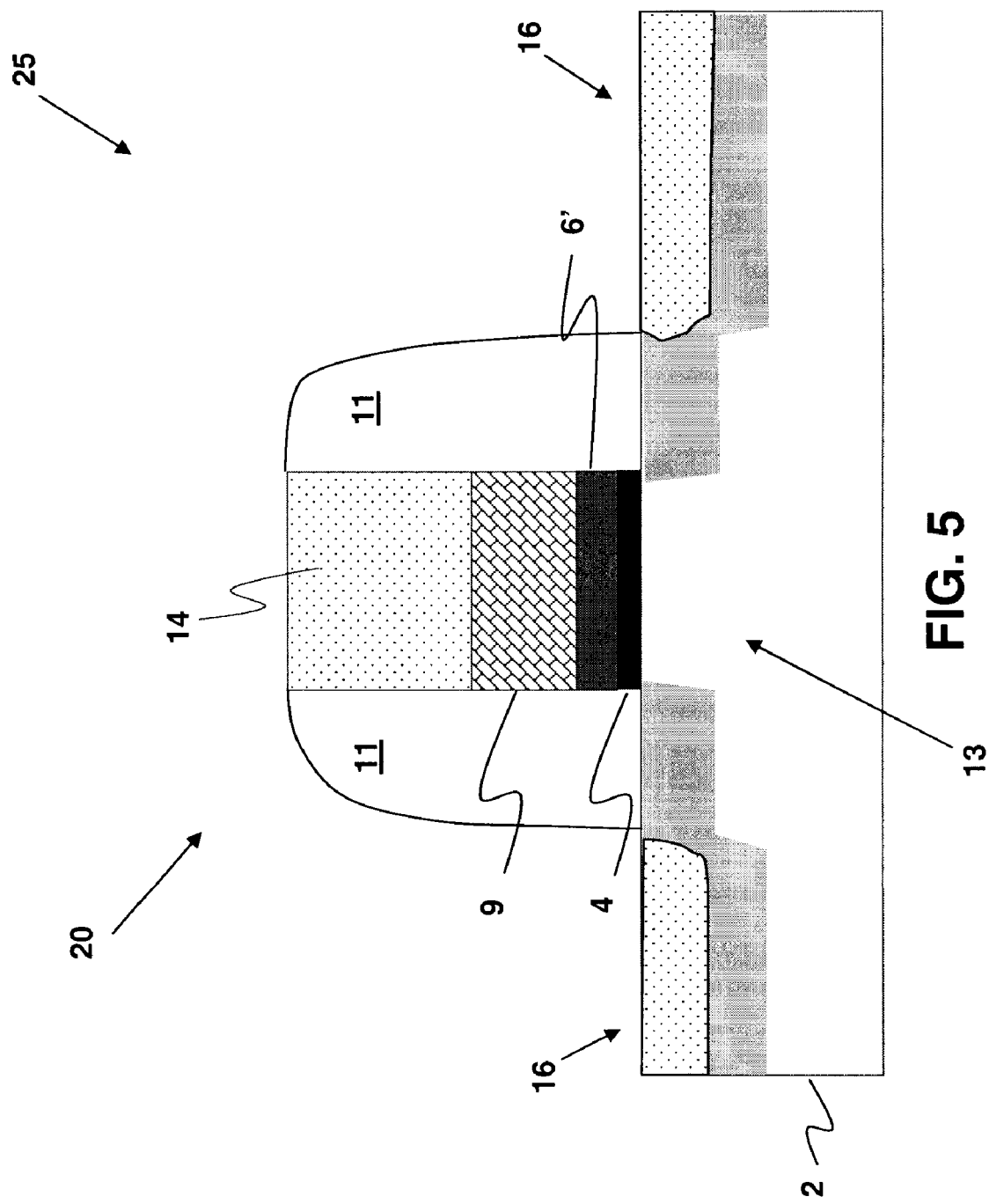
FIG. 5 shows a cross-sectional view of another embodiment of a structure according to the invention.

Referring to the drawings, FIG. 1 shows a cross sectional view of a structure at the beginning of a method according to one embodiment of the present invention. The methods ultimately induce a stress in a channel 13 (FIGS. 4, 5) of a transistor 25 (FIGS. 4, 5) as a result of the particular construction of a gate structure 20 (FIG. 4) in a MOSFET structure 25 (FIGS. 4, 5) thereby enhancing performance in MOSFET structure 25 (FIGS. 4, 5).

Referring to FIG. 1, a gate dielectric 4 may be formed over a substrate 2. A first layer of a silicon material 6 is formed over gate dielectric 4. A layer of a conducting material 8 is formed over first layer of silicon material 6. Typically, a second layer of a silicon material 10 is then formed over layer of conducting material 8.

Substrate 2 may include, for example, silicon, silicon-on-insulator (SOI), silicon germanium (SiGe), silicon carbide (SiC), silicon germanium carbon (SiGeC), gallium arsenide (GaAs), indium arsenide (InAs), indium phosphide (InP), or other suitable semiconductor substrates.

Gate dielectric 4 may include, for example, a silicon oxide ($SiO_2$), silicon oxynitride ($SiO_xN_y$), silicon nitride ($Si_3N_4$), or other metal oxides having a high dielectric constant. A thickness of gate dielectric 4 may be in range from approximately 0.5 nm to approximately 20 nm. First and second layers of silicon material 6, 10 may include, for example, polysilicon (poly-Si or poly), polysilicon germanium (poly-SiGe), or amorphous silicon.

Conducting material 8 may include a material from a group consisting of: nickel (Ni), tungsten (W), titanium (Ti), platinum (Pt), cobalt (Co), tantalum (Ta), molybdenum (Mo), osmium (Os), and rhenium (Re). Conducting material 8 may further include a metal, an alloy, germanium (Ge), and the like, or other suitable material now known or later developed, for purposes of aiding conduction. A thickness of layer of conducting material 8 formed between first layer of silicon material 6 and second layer of silicon material 10 may be in a range of approximately 10 angstroms to approximately 1,000 angstroms. Forming of conducting material 8, gate dielectric 4, and silicon materials 6, 10, may be provided by any known or later developed processes such as chemical vapor deposition (CVD), physical vapor deposition (PVD), and the like.

Figure 2:
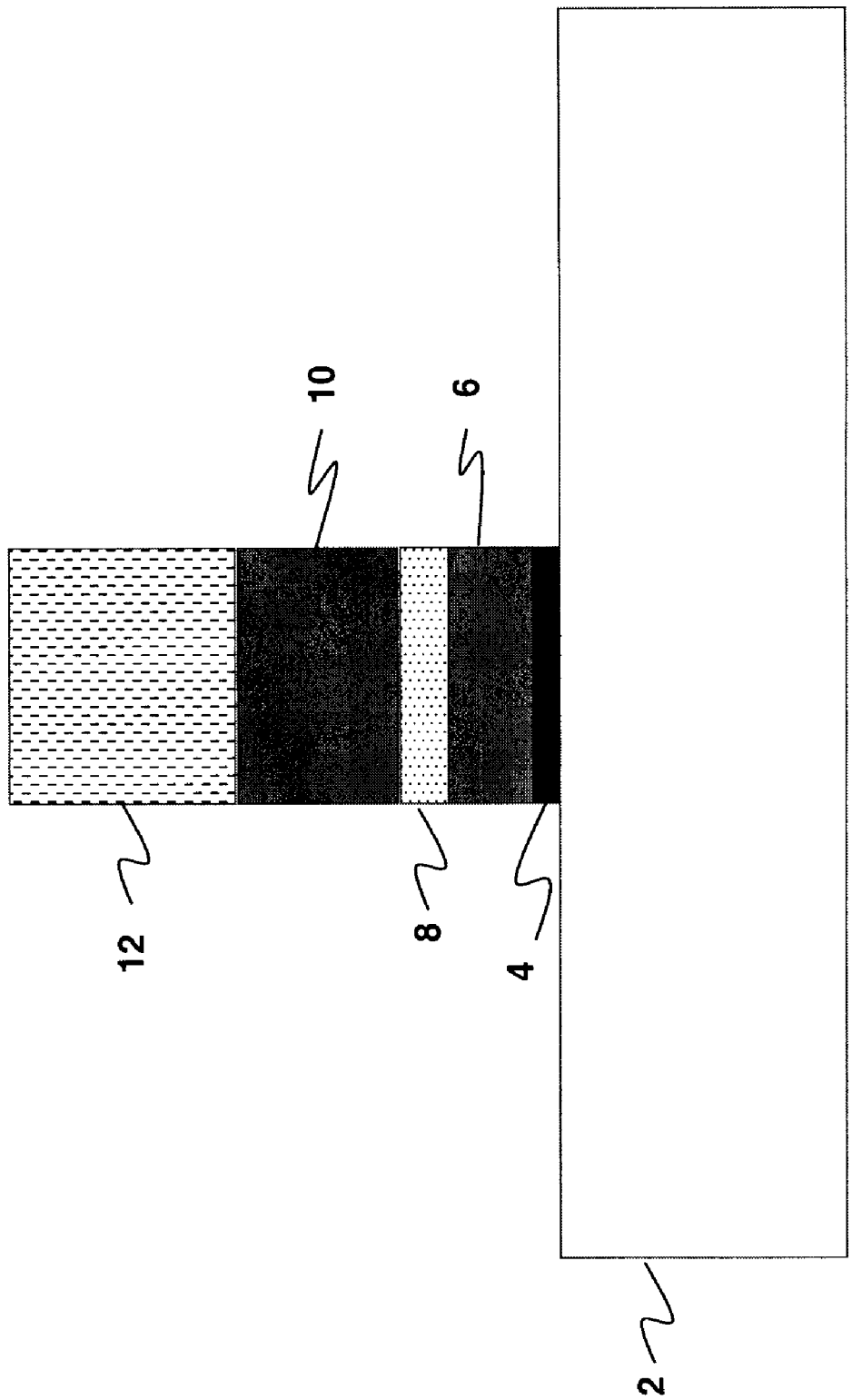

Next, as shown in FIG. 2, a photoresist 12 is patterned for gate structure 20 (FIG. 3) formation, and etching (e.g., reactive ion etching (RIE)) to remove portions of gate dielectric 4, first and second layer of silicon material (e.g., poly) 6, 10, and conducting material 8 is performed.

Figure 3:
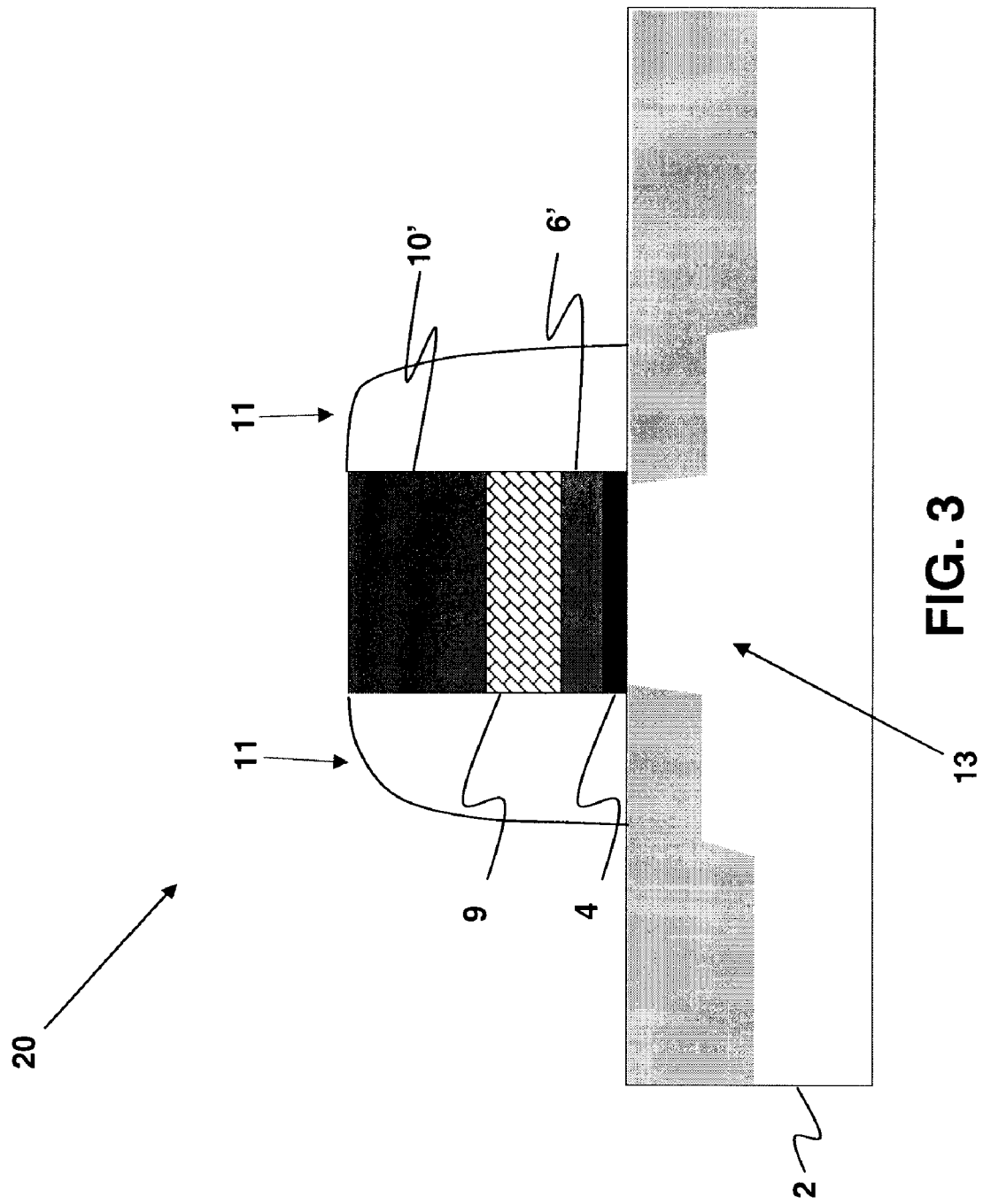

A subsequent step, as shown in FIG. 3, may include a conventional self-align processes, forming spacers, and using implants to form extensions and a source 16 and a drain 16 (see e.g., FIG. 4) employing now known or later developed techniques. In one embodiment, one or multiple anneal steps are performed, wherein elevated temperatures are applied, as is known in the art. This known anneal step has a tangential benefit of also forming a silicide 9 at the elevated temperature from a reaction of conducting material 8 (FIG. 2) and at least portions of adjoining silicon material 6, 10 (FIG. 2). For example, if silicon material 6, 10 includes poly, the silicon material 6, 10 will react with a selected conducting material 8 (e.g., tungsten) to form tungsten suicide ($WSi_2$). The elevated temperature may be in a range of approximately 300° C. to approximately 1,400° C., or may vary as suitable depending on particular materials (e.g., first layer of silicon material 6, conducting material 8, second layer of silicon material 10) being formed in gate structure 20.

A volume change occurs to various materials (e.g., first layer of silicon material 6 and conducting material 8) upon their reaction with each other in forming silicide 9. Prior to reaction, first layer of silicon material 6, second layer of silicon material 10, and conducting material 8 collectively may have a first volume. Subsequent to reaction of conducting material 8 with first layer of silicon material 6 (and optionally also with second layer of silicon material 10), silicide 9 is formed and a portion of first layer of silicon material 6', and a portion of second layer of silicon material 10' remain. Collectively, the remaining materials (i.e., 6', 9, 10') may have a second volume that is unequal to first volume. Change of volume may be an increase (i.e., expansion) or a decrease (i.e., shrinking) depending on what particular conducting material 8 is formed in gate structure 20. For example, certain metals (i.e., conducting material 8), such as osmium (Os), when reacting with polysilicon or amorphous silicon (e.g., first layer of silicon material 6) may increase in volume when osmium silicide ($OS_2Si_3$) as silicide 9 is formed therefrom. Conversely, certain metals (i.e., conducting material 8), such as nickel (Ni), platinum (Pt), or cobalt (Co), when reacting with polysilicon or amorphous silicon (e.g., first layer of silicon material 6) may decrease in volume when silicide 9 is formed therefrom.

Because the silicidation process is within a confined space of gate structure 20, when it is surrounded for example by a spacer 11, a stress will be induced in an area of channel 13 due to the aforementioned volume change in materials after forming of silicide 9. Induced stress in channel 13 may be compressive or tensile, depending on the type of volume change. If volume change is positive (i.e., expansion) after reaction, a tensile stress is induced in channel 13. If volume change is negative (i.e., shrinking) after reaction, a compressive stress is induced in channel 13. It is known that a tensile stress in channel 13 is beneficial in enhancing performance of n-type channel MOSFET (nFET); and, that a compressive stress in channel 13 is beneficial in enhancing performance of p-type channel MOSFET (pFET). Thus, depending on whether an nFET or PFET structure is being manufactured, a specific conducting material 8, for formation of silicide 9, may be selected and formed in gate structure 20 so as to create either a volume change increase or a volume change decrease and the concomitant induced compressive or tensile stress in channel 13. Different conducting materials 8 have different consumption rates when reacting with silicon (e.g., first layer of silicon material 6) to form a silicide 9. For example, if forming tungsten silicide ($WSi_2$) a ratio of thickness of silicide formed to a sum of total thickness of metal and silicon may be approximately 0.73 (i.e., less than 1), which results in a volume shrinkage inducing a compressive stress in channel 13. Thus, using tungsten as conducting material 8 (FIG. 1) would enhance performance of a PFET, because silicide 9 (i.e., tungsten silicide) will induce compressive stress in channel 13. Also for example, if forming osmium silicide ($OS_2Si_3$), a ratio of thickness of silicide formed to a sum of total thickness of metal and silicon may be approximately 1.59 (i.e., greater than 1), which results in a volume expansion inducing a tensile stress in channel 13. Thus, using osmium as conducting material 8 (FIG. 1) would enhance performance of a nFET, because silicide 9 (i.e., osmium silicide) will induce tensile stress in channel 13. An added benefit is that performance enhancement may be achieved for either nFET and PFET structures under methods employed herein.

Next, as shown in FIG. 4, a completed gate structure 20 for a MOSFET structure 25 is shown after completion of silicidation of source 16 and drain 16 and a conventional self-aligning process (not shown). Gate structure 20 may include gate dielectric 4, a remaining portion of first layer of silicon material 6', silicide 9, a remaining portion of second layer of silicon material 10', and a second, or top gate, silicide 14. Further, portions of source 16 and drain 16 may be converted to suicides (e.g., $CoSi_2$, NiSi, etc.) under known silicidation processes.

In completed gate structure 20, suicide 9 should not abut gate dielectric 4 (e.g., silicon oxide). First layer of silicon material 6' that remains (after forming silicidation process) should have a thickness of at least approximately 10 angstroms so as to serve as a separation of silicide 9 from gate dielectric 4. Thus, an initial thickness of first layer of silicon material 6 (FIG. 1) formed over gate dielectric 4 should be sufficient enough so that after the silicidation process, a remaining first layer of silicon material 6' is adequate (e.g., at least approximately 10 angstroms).

A completed gate structure 20 for a MOSFET structure 25 of a second embodiment is shown in FIG. 5 after completion of silicidation processes as discussed above. In this case, a second, or top gate, silicide 14 is in direct contact (i.e., abuts) with first silicide 9. That is, no second silicon material 10' (FIG. 3) remains in gate structure 20 after silicidation.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of stressing a channel of a transistor, comprising:
    forming a gate over the channel, wherein the gate includes materials including a gate dielectric, a first silicon layer over the gate dielectric, a conductive material over the first silicon layer, and a second silicon layer over the conductive material; and creating a volume change to at least a portion of the gate, thereby inducing a stress in the channel, by annealing at least one of a source and a drain adjacent to the channel, wherein the creating includes forming a silicide above the gate dielectric, leaving a layer of the first silicon layer between the silicide and the gate dielectric and a layer of the second silicon layer over the silicide.

2. The method of claim 1, wherein the conductive material is selected from a group consisting of: nickel (Ni), tungsten (W), titanium (Ti), platinum (Pt), cobalt (Co), tantalum (Ta), molybdenum (Mo), germanium (Ge), osmium (Os), and rhenium (Re).

* * * * *